United States Patent [19]

Tokunaga et al.

[11] Patent Number: 5,100,691

[45] Date of Patent: Mar. 31, 1992

[54] PROCESS FOR SELECTIVE FORMATION OF II-VI GROUP COMPOUND FLIM

[75] Inventors: Hiroyuki Tokunaga, Kawasaki; Takao Yonehara, Atsugi, both of Japan

[73] Assignee: Canon Kabushiki Kaisha, Tokyo, Japan

[21] Appl. No.: 686,868

[22] Filed: Apr. 16, 1991

Related U.S. Application Data

[63] Continuation of Ser. No. 587,162, Sep. 21, 1990, abandoned, which is a continuation of Ser. No. 174,381, Mar. 28, 1988, abandoned.

[30] Foreign Application Priority Data

Mar. 26, 1987 [JP] Japan .................................. 62-71991

[51] Int. Cl.$^5$ .......................... B05D 3/06; B05D 5/12; C23C 16/00
[52] U.S. Cl. ...................................... 427/38; 427/99; 427/248.1; 427/259; 427/261; 427/282; 156/612
[58] Field of Search .................... 427/38, 99, 259, 261, 427/282, 301, 248.1, 294; 156/612

[56] References Cited

U.S. PATENT DOCUMENTS

| | | | |
|---|---|---|---|
| 3,697,342 | 10/1972 | Cuomo | 156/13 |
| 4,066,481 | 1/1978 | Manasevit et al. | 148/174 |
| 4,216,037 | 8/1980 | Katoda et al. | 148/175 |
| 4,239,788 | 12/1980 | Beck | 427/43.1 |
| 4,467,521 | 8/1984 | Spooner et al. | 156/612 |
| 4,557,037 | 12/1985 | Hanoka et al. | 427/38 |
| 4,615,904 | 10/1986 | Ehrlich et al. | 427/38 |
| 4,637,127 | 1/1987 | Kurogi et al. | 156/612 |

Primary Examiner—Shrive Beck
Assistant Examiner—Marianne L. Padgett
Attorney, Agent, or Firm—Fitzpatrick, Cella, Harper & Scinto

[57] ABSTRACT

A process for selective formation of a II-VI group compound film comprises applying a compound film forming treatment, in a gas phase including a starting material for supplying the group II atoms of periodic table and a starting material for supplying the group VI atoms of periodic table, on a substrate having a non-nucleation surface ($S_{NDS}$) with small nucleation density and a nucleation surface ($S_{NDL}$) with larger nucleation density ($ND_L$) than the nucleation density ($ND_S$) of said non-nucleation surface ($S_{NDS}$) and a large area sufficient for a number of nuclei to be formed and forming selectively a II-VI group compound film only on said nucleation surface ($S_{NDL}$).

8 Claims, 7 Drawing Sheets

PROCESS FOR SELECTIVE FORMATION OF II-VI GROUP COMPOUND FLIM

This application is a continuation of application Ser. No. 07/587,162 filed Sept. 21, 1990, abandoned, which is a continuation of application Ser. No. 07/174,381, filed Mar. 28, 1988, which is now abandoned.

BACKGROUND OF THE INVENTION

1. Field of the Invention

This invention relates to a process for selective formation of a deposited film, particularly to a selective formation process for forming a deposited film of a II-VI group compound in a self-alignment fashion.

The selective formation process of a deposited film according to the present invention is applicable for, for example, preparation of thin films to be used for semiconductor integrated circuits, optical integrated circuits, etc.

2. Related Background Art

FIGS. 1A-1E illustrate the steps of the process for forming a thin film by photolithography of the prior art.

First, a substrate 1 comprising a material species with uniform composition as shown in FIG. 1A is washed, and then a thin film 2 is deposited on the whole surface of the substrate 1 according to various thin film depositing methods (vacuum vapor deposition method, sputtering method, plasma discharging method, MBE method, CVD method, etc.) (FIG. 1B).

Subsequently, on the thin film 2 is applied a photoresist 3 (FIG. 1C), and the photoresist 3 is exposed to light by use of a photomask of a desired pattern and the photoresist 3 is removed partially by development (FIG. 1D).

With the remaining photoresist 3 as the mask, the thin film 2 is etched to form a thin film 2 with a desired pattern (FIG. 1E). By repeating such photolithographic steps, thin films of desired patterns are laminated to constitute an integrated circuit. In that case, alignment between the thin films of the respective layers becomes an extremely important factor for the characteristics of the device. Particularly, in the case of the ultra-LSI where precision of submicron is demanded, precision of the shape of thin films of the respective layers is also extremely important along with alignment.

However, in the above process for forming a thin film of the prior art, it is difficult to effect necessary alignment of the photomasks with good precision, and also the precision of shape is insufficient, because thin films of desired patterns are formed by etching.

FIGS. 2A-2D illustrate the steps of the process for forming a thin film by use of lift-off of the prior art.

First, a photoresist 4 is applied on a substrate 1 (FIG. 2A), and the photoresist 4 with a desired pattern is removed by photolithography (FIG. 2B).

Subsequently, a thin film 5 is deposited according to a thin film deposition method (FIG. 2C), and the remaining photoresist 4 is dissolved away. By this operation, the thin film on the remaining photoresist 4 is removed at the same time, whereby a thin film 5 with a desired pattern is formed. By repeating the above steps, an integrated circuit is constituted.

However, such a thin film forming process, because a thin film is formed on a photoresist, requires to perform deposition of a thin film at a temperature not higher than the resistant temperature of the photoresist, whereby the deposition method is greatly restricted. Also, in removing the photoresist, the shape of the remaining thin film is influenced thereby and therefore precision of the shape becomes insufficient. Also, there is also the problem that the side wall or the inner portion of the thin film may be highly probably contaminated with carbon, etc. which is the component of the photoresist, etc.

Also, as the selective deposition method, there has been known the method in which a monocrystal substrate is covered partially with an amorphous thin film, and the same material as the substrate material is epitaxially grown selectively only at the exposed portion of the monocrystal substrate. For example, there are the selective epitaxial growth (SEG) method in which a silicon monocrystal substrate is partially covered with silicon oxide to effect selective growth of silicon (B. D. Joyce & J. A. Baldrey, Nature Vol. 195, 485, 1962), the method in which a GaAs substrate is covered partially with an amorphous thin film such as $SiO_2$, $Si_3N_4$, etc. to effect selectively epitaxial growth of GaAs (P. Rai-Choudhury & D. K. Schroder, J. Electrochem. Soc., 118, 107, 1971), etc.

However, these selective deposition methods, because of growing selectively the monocrystal semiconductor of the same kind from the exposed surface of a monocrystal substrate, are limited in the deposition surface for the base to monocrystalline semiconductors, and therefore not applicable to polycrystalline substrates, amorphous insulating substrates.

Thus, the deposited film forming method of the prior art is limited in available substrates, and further there are involved problems also in shape of the pattern, dimensional precision of the deposited film formed.

SUMMARY OF THE INVENTION

An object of the present invention is to solve such problems of the prior art and provide a process for forming a II-VI group compound film with any desired shape in a self-alignment fashion at any desired portion of a substrate, irrespectively of the crystallinity of the base substrate.

According to the present invention, there is provided a process for forming a II-VI group compound film comprising applying a compound film forming treatment, in a gas phase including a starting material for supplying the group II atoms of the periodic table and a starting material for supplying the group VI atoms of the periodic table, on a substrate having a non-nucleation surface ($S_{NDS}$) with small nucleation density and a nucleation surface ($S_{NDL}$) with larger nucleation density ($ND_L$) than the nucleation density ($ND_S$) of said non-nucleation surface ($S_{NDS}$) and a large area sufficient for a number of nuclei to be formed, and forming selectively a II-VI group compound film only on said nucleation surface ($S_{NDL}$).

DETAILED DESCRIPTION OF THE PREFERRED EMBODIMENTS

The II-VI group compounds to be used in the present invention are not limited to 2-element compounds, but also include multi-element II-VI group mixed crystal compounds of 3 elements or more.

Generally, the deposited film formation process is considered as follows.

When the substrate having a deposition surface is a material different in kind from the flying atoms, particularly an amorphous material, the flying atoms will be freely diffused on the substrate surface, or revaporized. And, as the result of collision mutually between the atoms, a nucleus is formed, and when the nucleus reaches the size rc where the change $\Delta G$ in its free energy G becomes the maximum (stable nucleus) or more, $\Delta G$ is reduced and the nucleus continues to grow stably three-dimensionally and becomes shaped in an island form.

The change $\Delta G$ is free energy G created by formation of nucleus is represented as follows:

$$G = 4\pi f(\theta)(\sigma_o r^2 + \frac{1}{3} \cdot gv \cdot r^3)$$

$$f(\theta) = \frac{1}{4}(2 - 3\cos\theta + \cos^2\theta)$$

where
r: radius of curvature of nucleus
$\theta$: contact angle of nucleus
gv: free energy per unit volume
$\pi_o$: surface energy between nucleus and vacuum.

Figure 3:
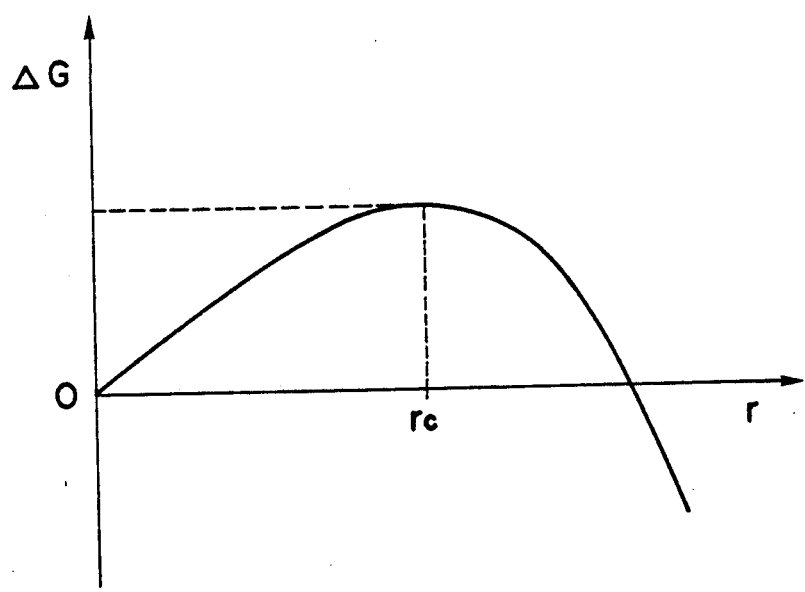
FIG. 3 is a line diagram showing the relationship between the change $\Delta G$ is free energy G and the radius of nucleus.

The manner in which $\Delta G$ is changed is shown in FIG. 3. In FIG. 3, the radius or curvature of the stable nucleus when $\Delta G$ is at the maximum value is rc.

Thus, the nucleus grows to become shaped in an island form, and further grows until contact mutually between islands proceeds to cover the substrate surface in the shape of a network, finally covering completely the substrate surface as a continuous film. Through such process, a thin film is deposited on the substrate.

In the deposition process as described above, the density of the nucleus formed per unit area of the substrate surface depends greatly on the interaction between the flying atoms and the substrate, and is also greatly influenced by the deposition conditions, typically the temperature.

Accordingly, the selecting appropriately the kinds of material for the deposited film and the substrate material, and setting appropriately the deposition conditions such as temperature, pressure, gas species, etc., the nucleation density (or nucleation speed) can be determined. Therefore, when one kind of material to be deposited is used and deposits on a deposition surface comprising two or more kinds of surfaces differing greatly in the above nucleation density, the deposited film can be formed selectively depending on the difference of nucleation density, for example, it is formed selectively as described below.

FIGS. 4A-4D illustrate schematically the process of forming a deposited film according to the present invention.

First, the two kinds of materials constituting the deposition surface are called A and B, and the material to be deposited C, and the above materials A, B and C are selected so that the nucleation density of the material to be deposited C for the materials A and B may differ greatly, under certain deposition conditions. Here, it is supposed that the nucleation density for the material A is sufficiently great, and the nucleation density for the material B is negligibly small.

Figure 4A:
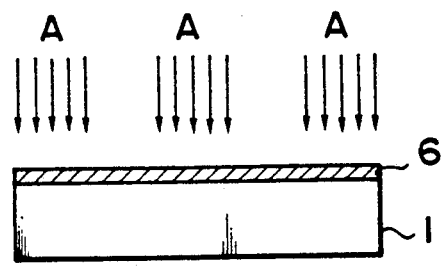
FIGS. 4A-4D illustrates schematically the process for selective formation of a deposited film according to the present invention.

In FIG. 4A, on a substrate 1 of a material resistant to high temperatures such as high-melting glass, quartz, alumina, ceramics, etc., a thin film 6 of the materials B is deposited according to a thin film forming method, and ions of the material A are implanted with a desired pattern by use of the converging ion beam implantation technique thereon.

Figure 4B:
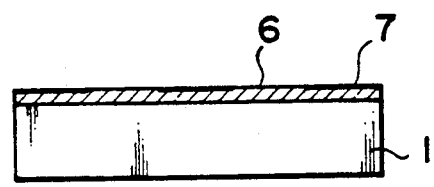

By this process, as shown in FIG. 4B, a region 7 of the material A is formed with a desired pattern so as to have a large area sufficient for a number of nuclei for crystal growth to be generated on the thin film 6 of the material B.

Figure 4C:
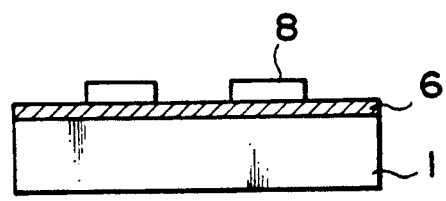
Figure 4D:
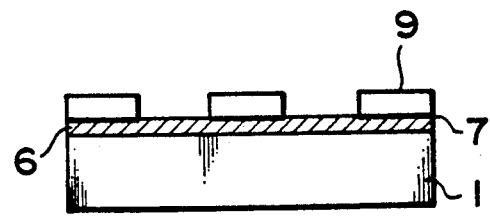

Thus, as the method for forming the region 7 constituted of the material A with a desired pattern on the deposition surface, as shown in FIG. 4C, a mask 8 may be formed with a desired pattern on the material B, and ions of the material A injected on the whole surface to provide the region 7, thereby forming a deposition surface as shown in FIG. 4B.

Also, a thin film of the material A may be formed on the material B, and the film of the material A may be formed to a desired pattern by photolithography.

As shown in FIG. 4B, on the deposition surface constituted of the material A and the material B to a desired pattern, the material C is deposited under predetermined conditions. At this time, no material C is deposited on the thin film 6 of the material B.

This may be considered to be due to revaporization of the flying atoms of the material C before becoming stable nucleus, or due to formation of a substance with high vapor pressure through the reaction of C atoms with the material B, whereby the material B is etched.

Thus, only on the region 7 of the material A, the material C is deposited, and consequently a deposited film 9 with same pattern as the pattern of the region 7 of the material A can be formed in a self-alignment fashion.

The present invention is described in more detail below by referring to Examples along with the drawings.

EXAMPLE 1

Referring to FIGS. 5A-5E, the process for forming a CdSe film on $SiO_2$ is described as a first example of the present invention.

Figure 5A:
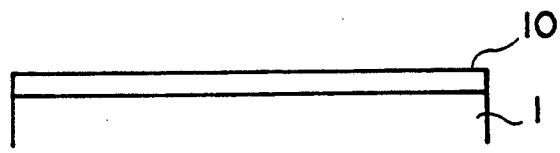
FIGS. 5A-5E illustrates the steps showing an example of selective formation of a CdSe film.

On a substrate 1 resistant to high temperature comprising alumina, a $SiO_2$ film 10 was deposited to about 1000 Å by conventional CVD (chemical vapor deposition) by use of silane ($SiH_4$) and oxygen ($O_2$) [FIG. 5A]. The nucleation density (NDs) of CdSe on the $SiO_2$ film is small, and the $SiO_2$ film 10 becomes the non-nucleation surface ($S_{NDS}$).

Figure 5B:
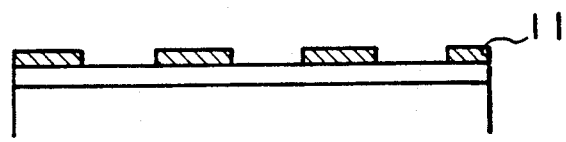
Figure 5C:
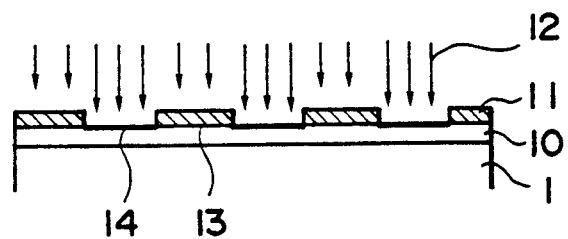

Next, the surface of the $SiO_2$ film 10 was masked with a photoresist 11 to a desired pattern. [FIG. 5B].

By use of an ion implanter, Se ions 12 were implanted at a density of $3 \times 10^{16}/cm_2$. The Se ions were implanted only on the surface exposed [FIG. 5C]. At the SiO$_2$ film surface 13 where no Se ion is implanted, the nucleation density (NDs) of CdSe is small, and this portion becomes the non-nucleation surface (S$_{NDS}$) as described above. On the other hand, the region 14 where Se ions are implanted has larger nucleation density (ND$_L$) than the non-nucleation surface (S$_{NDS}$), which portion becomes the nucleation surfaces (S$_{NDL}$). The size of the region 7 was made 1 mm $\times$ 1 mm square.

Figure 5D:
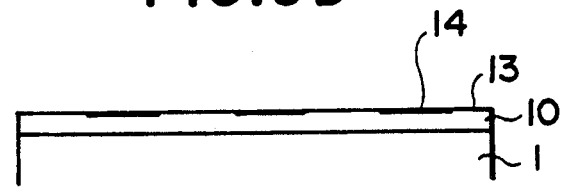

After the photoresist was peeled off, the substrate 1 was subjected to heat treatment in a PCl$_3$ atmosphere at about 450° C. for about 10 minutes to clean the surface [FIG. 5D].

Figure 5E:
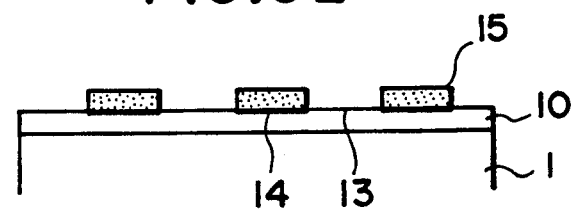

Subsequently, while the substrate 1 was heated to 500° C., diethyl cadmium (DECd) and selenium hydride (H$_2$Se) at a molar ratio of 1:5 were flowed together with a carrier gas H$_2$ onto the substrate surface to grow a CdSe film according to the MOCVD (organometallic chemical vapor deposition) method. The reaction pressure was made 10 Torr. As shown in FIG. 5E, CdSe film 15 was formed only on the nucleation surface (S$_{NDL}$) 14 formed by implantation of Se ions, and no CdSe film was formed on the non-nucleation surface (S$_{NDS}$) 13, namely the SiO$_2$ surface where no Se ion was implanted.

Accordingly, as can be seen from the above, by implantation of Se ions with a desired pattern, a CdSe film with any desired shape and dimension can be selectively formed.

EXAMPLE 2

Referring to FIG. 6, preparation steps of a CdSe thin film transistor as an example of the present invention are described.

Figure 6A:
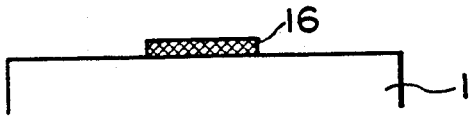
FIGS. 6A-6F are preparation steps of a CdSe thin film transistor using the process of the present invention.

First, an Al film was deposited on an alumina substrate 1 to about 1000 Å according to the vacuum vapor deposition method, followed by patterning by conventional photolithographic technique to form a gate electrode 16 [FIG. 6A].

Figure 6B:
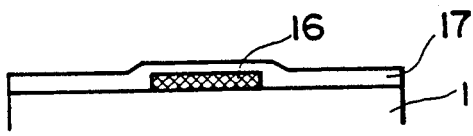
Figure 6C:
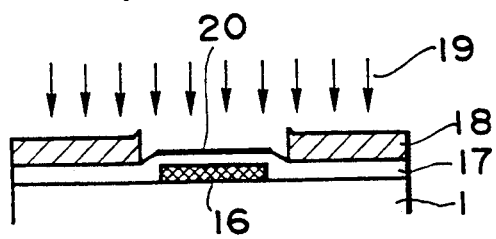

Next, according to the sputtering method, a SiO$_2$ film 17 was deposited to about 3000 Å to give a gate oxide film [FIG. 6B].

With the SiO$_2$ film 17 being masked with a photoresist 18, Se ions 19 were implanted into the SiO$_2$ film only at the transistor forming region by use of an ion implanter. The amount implanted was $3 \times 10^{15}$/cm$^2$. Thus, a nucleation surface (S$_{NDL}$)$^{20}$ having a large nucleation density (ND$_L$) was formed [FIG. 6C].

Figure 6D:
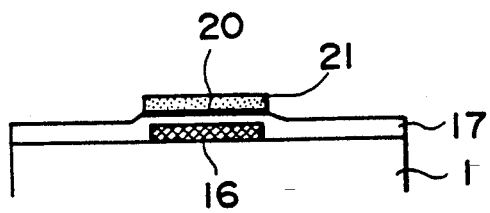

After the photoresist was peeled off, the surface was cleaned by subjecting it to the heat treatment in PCl$_3$ atmosphere at about 450° C. for about 10 minutes. Next, a CdSe film was grown selectively according to the MOCVD method. By use of diethyl cadmium (DECd) and H$_2$Se as the starting gases, both were fed at a mixing ratio of 1:5 (molar ratio) together with a carrier gas H$_2$ onto the substrate. It has been found that at this time, crystallinity of CdSe to be formed can be improved by addition of 1 to 2% of HCl in the carrier gas H$_2$. The reaction pressure was made 30 Torr, and the substrate temperature 450° C. Thus, as shown in FIG. 6D, the SiO$_2$ surface having small nucleation density (NDs) became the non-nucleation surface (S$_{NDS}$), and the ion implanted portion having larger nucleation density (ND$_L$) became the nucleation surface (S$_{NDL}$), whereby CdSe 21 was formed selectively only on the nucleation surface (S$_{NDL}$) 20.

Figure 6E:
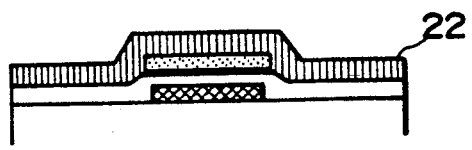

Next, an Al film 22 was formed by vacuum vapor deposition on the whole surface of the SiO$_2$ film 17 and the CdSe film 20. [FIG. 6E].

Figure 6F:
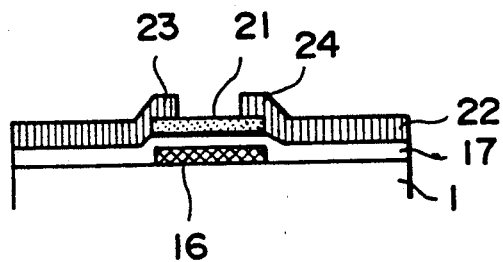

Finally, according to photolithographic technique, the Al film was worked to form the source electrode 23 and the drain electrode 24, thus completing a thin film transistor [FIG. 6F].

Thus, according to the process of the present invention, since a CdSe film can be formed selectively only on the nucleation surface (S$_{NDL}$), a thin film transitor can be prepared without chemically etching CdSe as different from the prior art method. For this reason, thin film transistors of good quality could be prepared with good yield, as compared with the prior art method.

EXAMPLE 3

FIGS. 7A–7E illustrate the film formation steps of another example of the present invention.

Figure 7A:
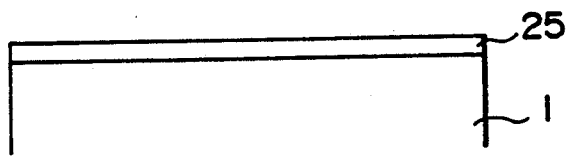
FIGS. 7A-7E illustrates the steps showing another example of selective formation of a CdSe film.
Figure 7B:
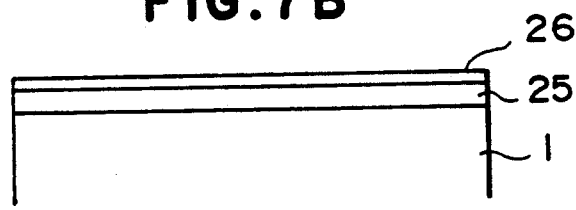

First, similarly as in Example 1, on the surface of a substrate 1 resistant to high temperature comprising alumina, a SiO$_2$ film 25 was deposited to about 1000 Å according to the CVD method by use of SiH$_4$ and O$_2$ [FIG. 7A].

Next, by means of an arc discharge type ion plating device, on the SiO$_2$ film 25 was formed an Al$_2$O$_3$ film. After the device was internally evacuated to $10^{-5}$ Torr, O$_2$ gas was introduced to $3 \times 10^{-4}$ Torr, and an Al$_2$O$_3$ film 26 was deposited to about 300 Å on the substrate heated to 400° C. at an ionization voltage of 50 V, a substrate potential of $-50$ V and an output of 500 W [FIG. 7B].

Figure 7C:
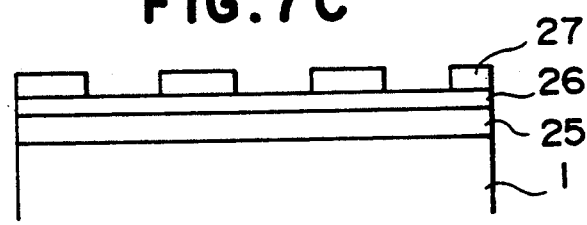

With a photoresist 27 masked to a desired pattern on the Al$_2$O$_3$ film 26, the portion of the Al$_2$O$_3$ film exposed was etched with an etchant of H$_3$PO$_4$:HNO$_3$:CH$_3$COOH:H$_2$O = 16:1:2:1 [FIG. 7C]. At this time, the substrate was heated to about 40° C.

Figure 7D:
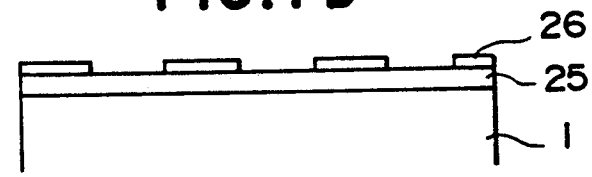

After the photoresist 27 was peeled off, the substrate 1 was subjected to heat treatment in a PCl$_3$ atmosphere at about 450° C. for about 10 minutes to clean the surface [FIG. 7D]. On the SiO$_2$ surface 25, nucleation density (NDs) of CdSe is small, which portion becomes the non-nucleation surface (S$_{NDS}$). On the other hand, Al$_2$O$_3$ 26 has larger nucleation density (ND$_L$) than the non-nucleation surface (S$_{NDS}$) 25, which portion becomes the nucleation surface (S$_{NDL}$).

Figure 7E:
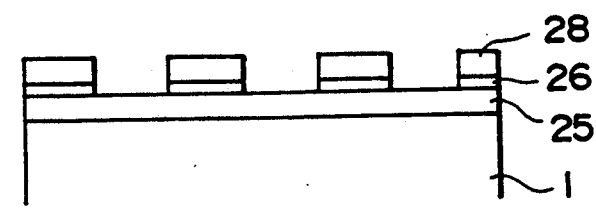

Subsequently, while the substrate 1 was heated at 450° C., diethylcadmium (DECd) and selenium hydride (H$_2$Se) at a molar ratio of 1:5 were flowed together with a carrier gas H$_2$ onto the substrate surface to grow a CdSe film according to the MOCVD (organometallic chemical vapor deposition) method. The reaction pressure was made about 30 Torr. As shown in FIG. 7E, CdSe film 28 was formed only on the Al$_2$O$_3$ nucleation surfaces (S$_{NDL}$) 26, and no CdSe film was formed on the non-nucleation surface (S$_{NDS}$) 25, namely the SiO$_2$ surface. The size of the nucleation surface (S$_{NDL}$) 26 was made 1 mm $\times$ 1 mm square.

Thus, also according to the process of this Example, it could be confirmed that a CdSe film with any desired shape and dimension was selectively formed on any desired substrate.

EXAMPLE 4

A ZnSSe mixed crystal II–VI group compound film was selectively formed as follows.

After deposition of a SiO$_2$ film to about 1000 Å on an alumina substrate 1 according to the CVD method by use of SiH$_4$ and O$_2$ in the same manner as in Example 1, with a photoresist masked to a desired pattern on the surface, Se ions were implanted into the exposed SiO$_2$ at $1 \times 10^{15}$/cm$^2$ by use of an ion implanter.

Next, the resist film was peeled off, and the substrate 1 was subjected to heat treatment in a PCl$_3$ atmosphere at about 450° C. for about 10 minutes to clean the surface.

Also for the ZnSSe mixed crystal, the SiO$_2$ film portion implanted with no Se ions has smaller nucleation density (ND$_S$) to become the non-nucleation surface (S$_{NDS}$). On the other hand, the SiO$_2$ film portion implanted with Se ions has larger nucleation density (ND$_L$) to become the nucleation surface (S$_{NDL}$).

Onto the substrate surface having the nucleation surface (S$_{NDL}$) and the non-nucleation surface (S$_{NDS}$) thus having a nucleation density difference ($\Delta$ND), by use of H$_2$ as the carrier gas, dimethylzinc (DMZ), dimethylselenium (DMSe) and diethylsulfur (DES) were flowed at a ratio of DMZ:(DMSe+DES) of 1:8 (molar ratio). The substrate temperature was made 500° C. by heating. The reaction pressure was made 100 Torr. Similarly as shown in FIG. 5E, only on the nucleation surface (S$_{NDL}$) formed by implantation of Se ions, the ternary mixed crystal II-VI group compound ZnSSe film was formed selectively. In this case, the size of the nucleation surface (S$_{NDL}$) was made 1 mm $\times$ 0.5 mm square.

The ratio of S and Se in ZnSSe can be freely controlled by varying the ratio of the reactive gases DES and DMSe.

EXAMPLE 5

A chalcopyrite type compound film with the group II element in the II-VI compound substituted with the group I element and the group III element was formed as follows.

Similarly as in the respective examples described above, a SiO$_2$ film was formed on the substrate, and Se ions were partially implanted thereon similarly as in Example 1 to form a nucleation surface (S$_{NDL}$). In this example, as in Example 3, an Al$_2$O$_3$ film may be formed on SiO$_2$ film, followed by patterning to form a nucleation surface (S$_{NDL}$). A chalcopyrite film was selectively formed according to the MOCVD method only on the fine nucleation surface (S$_{NDL}$) on the substrate having the non-nucleation surface (S$_{NDS}$) and the nucleation surface (S$_{NDL}$). In the case of forming a CuGaS$_2$ film, cyclopentadienyltriethylphosphine copper [C$_5$H$_5$CuP(C$_2$H$_5$)$_3$], trimethylgallium (TMG) and hydrogen sulfide (H$_2$S) were supplied as the reactive gases together with the carrier gas H$_2$ onto the substrate. C$_2$H$_5$CuP(C$_2$H$_5$)$_3$ and TMG were supplied in equal moles, with the amount of H$_2$S being made about several-fold of the sum of the former two. The reaction pressure was made 50 Torr, and the substrate temperature 600° C. Thus, CuGaS$_2$ could be formed selectively only on SiO$_2$ implanted with Se ions.

As shown in the above Examples, according to the present invention, a nucleation surface (S$_{NDL}$) having a large nucleation density (ND$_L$) can be formed to a desired pattern and a II-VI group compound semiconductor film following the pattern can be formed.

In the above Examples, there are shown examples of forming a SiO$_2$ film by the CVD method, but it is also possible to form a SiO$_2$ film by the sputtering method. Further, quartz with its surface well flattened itself can be also used as the deposition surface.

The ion species to be implanted for formation of the nucleation surface (S$_{NDL}$) is not limited to Se ions, but ions of the group II elements, ions of the group VI elements, further ions of the group III elements and ions of the group V elements can be also used.

By use of dimethylzinc, diethylzinc [Zn(C$_2$H$_5$)$_2$], dimethylcadmium [Cd(CH$_3$)$_2$], diethylcadmium, dipropylcadmium [Cd(C$_3$H$_7$)$_2$], dibutylcadmium [Cd(C$_4$H$_9$)$_2$], dimethylmercury [Hg(CH$_3$)$_2$], diethylmercury [Hg(C$_2$H$_5$)$_2$] as the starting gas of the group II element, and hydrogen sulfide (H$_2$S), selenium hydride, dimethylselenium, diethylselenium [Se(C$_2$H$_5$)$_2$], dimethyldiselenide [CH$_3$SeCH$_3$], dimethyltellurium [Te(CH$_3$)$_2$], diethyltellurium [Te(C$_2$H$_5$)$_2$] as the starting gas of the group VI element, films of II-VI group compounds ZnS, ZnTe, CdS, CdTe, HgSe and mixed crystal compound films thereof can be formed according to the combinations of these selectively on the nucleation surface (S$_{NDL}$). Selective formation of a ZnO film is also possible.

A mixed crystal compound semiconductor can be formed selectively on Al$_2$O$_3$ provided on the SiO$_2$ similarly as in Example 2 as the nucleation surface (S$_{NDL}$), as a matter of course.

Further, in the respective Examples as described above, examples in which the MOCVD method is used in the step of selective formation of a CdSe and a ZnSSe films have been shown, but selective formation of the II-VI group compound film of the present invention can be also practiced according to entirely the same principle by use of MBE (molecular beam epitaxy) method LPE (liquid phase growth) method, etc.

As described in detail above, the process for selective formation of a II-VI group compound film can form self-matchingly a deposited film of a desired pattern by utilizing the nucleation density difference ($\Delta$ND) depending on the kinds of the II-VI group compound deposition surface materials, and therefore a deposited film with a desired pattern can be formed at high precision, which is advantageous particularly in constituting a highly integrated circuit. Further, the materials of the deposition surface are not required to be limited to only monocrystal but a II-VI group compound deposited film can be formed at high precision also on an amorphous insulating material by selecting the material for forming nucleation surface (S$_{NDL}$) and the material for forming non-nucleation surface (S$_{NDS}$) having nucleation density difference.

Particularly, in the case of a compound semiconductor with large influence by chemical etching, a pattern can be formed without etching of the film itself, and therefore it becomes possible to maintain chemical stability of the film prepared at high level.

We claim:

1. A process for selective formation of a II-VI group compound film, which comprises:
    (a) depositing a nucleation surface (S$_{NDL}$) of aluminum oxide on a non-nucleation surface (S$_{NDS}$) of a substrate, said aluminum oxide having a larger nucleation density (ND$_L$) than the nucleation density (ND$_S$) of said non-nucleation surface (S$_{NDS}$) and a large area sufficient for a number of nuclei to be formed; and
    (b) applying a compound film-forming treatment in a gas phase including employing a starting material for supplying the group II atoms of the periodic table and a starting material for supplying the group VI atoms of the periodic table to selectively form a II-VI group compound film only on said nucleation surface (S$_{NDL}$).

2. A process for selective formation of a II-VI group compound film according to claim 1, wherein said II-VI group compound film is a binary system II-VI group compound film.

3. A process for selective formation of a II-VI group compound film according to claim 1, wherein said II-VI group compound film is a multi-component system mixed crystal II-VI group compound film of at least a three-component system.

4. A process for selective formation of a II-VI group compound film according to claim 1, wherein the group II atoms in the II-VI group compound are substituted with group I atoms and group III atoms and the compound film is a group I-III-IV compound film.

5. A process for selective formation of a II-VI group compound film according to claim 1, wherein said non-nucleation surface is comprised of an amorphous insulating material.

6. A process for selective formation of a II-VI group compound film according to claim 5, wherein said amorphous insulating material is $SiO_2$.

7. A process for selective formation of a II-VI group compound film according to claim 1, wherein said compound film forming treatment is an organometallic chemical vapor deposition.

8. A process for selective formation of a II-VI group compound film, which comprises:
(a) ion implanting a nucleation surface ($S_{NDL}$) on a part of a non-nucleation surface ($S_{NDS}$) of a substrate, said non-nucleation surface ($S_{NDS}$) comprising an amorphous insulating material, said nucleation surface ($S_{NDL}$) having a larger nucleation density ($ND_L$) than the nucleation density ($ND_S$) of the non-nucleation surface ($S_{NDS}$) and a large area sufficient for a number nuclei to be formed; and
(b) applying a compound film-forming treatment in a gas phase including employing a starting material for supplying the group II atoms of the periodic table and a starting material for supplying the group VI atoms of the periodic table to selectively form a II-VI group compound film only on said nucleation surface ($S_{NDL}$).

* * * * *

UNITED STATES PATENT AND TRADEMARK OFFICE
CERTIFICATE OF CORRECTION

PATENT NO. : 5,100,691

DATED : March 31, 1992

INVENTOR(S) : HIROYUKI TOKUNAGA, ET AL.

It is certified that error appears in the above-identified patent and that said Letters Patent is hereby corrected as shown below:

COLUMN 1

Figure 1A:
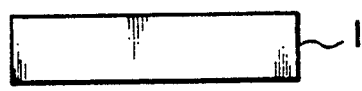
FIGS. 1A-1E illustrates the steps showing a thin film forming process according to photolithography of the prior art.
Figure 1B:
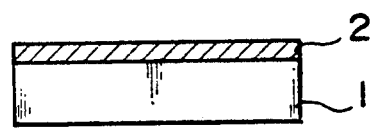
Figure 1C:
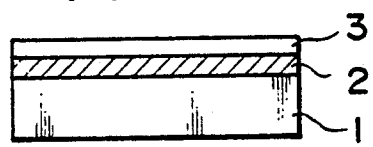
Figure 1D:
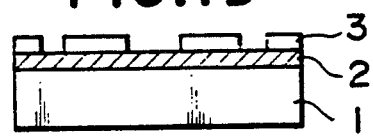
Figure 1E:
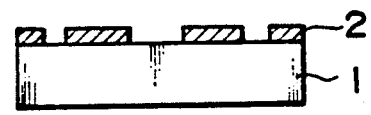
Figure 2A:
FIGS. 2A-2D illustrates the steps showing a thin film forming process by use of lift-off of the prior art.
Figure 2B:
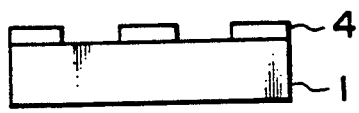
Figure 2C:
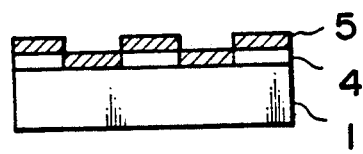
Figure 2D:
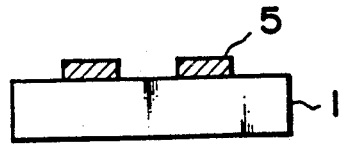

Line 38, "(FIG. 1E). By" should read --(FIG. 1E). ¶ By--.

COLUMN 2

Line 29, "strates," should read --strates, or--.
Line 64, "is" should read --in--.

COLUMN 3

Line 29, "$\Delta G$ is" should read --$\Delta G$ in--.
Line 32, "G=" should read --$\Delta G$=--.
Line 40, "$\pi_o$:" should read --$\sigma_o$:--.
Line 67, ", for" to read--. For--.

COLUMN 4

Line 15, "materials B" should read --material B--.
Line 33, "the film" should read --the thin film--.
Line 68, "$3\times 10_{16}/cm_2$." should read --$3\times 10^{16}/cm^2$.--.

COLUMN 5

Line 8, "surfaces" should read --surface--.
Line 48, "nucleation surface $(S_{NDL})^{20}$" should read --nucleation surface $(S_{NDL})$ 20--.

COLUMN 6

Line 10, "transitor" should read --transistor--.
Line 43, "$Al_2O_3$ 26" should read --$Al_2O_3$ film 26--.

UNITED STATES PATENT AND TRADEMARK OFFICE
CERTIFICATE OF CORRECTION

PATENT NO. : 5,100,691
DATED : March 31, 1992
INVENTOR(S) : HIROYUKI TOKUNAGA, ET AL.

It is certified that error appears in the above-identified patent and that said Letters Patent is hereby corrected as shown below:

COLUMN 7

Line 51, "$C_2H_5CuP(C_3H_5)_3$" should read --$C_5H_5CuP(C_2H_5)_3$--.

COLUMN 8

Line 29, "method" should read --method,--.

COLUMN 9

Line 15, "group I-III-IV compound film." should read --group I-III-VI compound film.--.

COLUMN 10

Line 14, "number nuclei" should read --number of nuclei--.

Signed and Sealed this

Ninth Day of November, 1993

Attest:

BRUCE LEHMAN

Attesting Officer

Commissioner of Patents and Trademarks